United States Patent [19]
Kim et al.

[11] Patent Number: 6,165,823
[45] Date of Patent: *Dec. 26, 2000

[54] THIN FILM TRANSISTOR AND A FABRICATING METHOD THEREFOR

[75] Inventors: Hyung Tae Kim; Woun Suck Yang, both of Chungcheongbuk-do, Rep. of Korea

[73] Assignee: LG Semicon Co., Ltd., Chungcheongbuk-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/873,300

[22] Filed: Jun. 11, 1997

Related U.S. Application Data

[62] Division of application No. 08/779,116, Jan. 6, 1997, Pat. No. 5,668,391, which is a continuation of application No. 08/510,338, Aug. 2, 1995, abandoned.

[51] Int. Cl.[7] ........................................... H01L 21/00
[52] U.S. Cl. ........................... 438/156; 438/206; 438/268
[58] Field of Search .................................. 438/156, 157, 438/206, 212, 213, 268, 269, FOR 192, FOR 176, FOR 177; 257/329, 328

[56] References Cited

U.S. PATENT DOCUMENTS

| | | |
|---|---|---|
| 5,308,778 | 5/1994 | Fitch et al. . |
| 5,308,782 | 5/1994 | Mazure et al. . |
| 5,324,673 | 6/1994 | Fitch et al. . |
| 5,340,754 | 8/1994 | Witek et al. . |
| 5,376,562 | 12/1994 | Fitch et al. . |
| 5,414,289 | 5/1995 | Fitch et al. ............................ 257/329 |
| 5,527,723 | 6/1996 | Witek et al. . |
| 5,554,870 | 9/1996 | Fitch et al. . |
| 5,780,888 | 7/1998 | Maeda et al. . |

OTHER PUBLICATIONS

IEDM 90—pp. 469–472, Ikeda et al., "A Polysilicon Transistor Technology for Large Capacity SRAMs", 1990.
IEDM 92—pp. 823–826, Lici et al., "High Reliability and High Performance . . . LDD Structures", 1992.
"A Polysilicon Transistor Technology for Large Capacity SRAMs", Ikeda et al., 1990 IEEE International Electron Devices Meeting, Dec. 1990, pp. 469–472.

*Primary Examiner*—Charles Bowers
*Assistant Examiner*—Scott J. Hawranek

[57] ABSTRACT

A thin film transistor includes a first insulating layer and a first conductive layer formed on a semiconductor substrate, a second insulating layer, a second conductive layer and a third insulating layer sequentially formed on the first conductive layer, a contact hole formed in the second insulating layer, second conductive layer and third insulating layer, a gate insulating layer formed along the sidewall of the contact hole, and a third conductive layer formed on the contact hole formed with the gate insulating layer thereon and surface of the third insulating layer to be used as a channel region and a source region by implanting an impurity, in which a drain region, a gate electrode and the source region are stacked, or vertically aligned, on the substrate to allow a cell to occupy a small area for accomplishing high packing density of the cell and permit the gate electrode to encircle the channel region for improving a characteristic of the transistor, thereby stabilizing the cell.

7 Claims, 4 Drawing Sheets

THIN FILM TRANSISTOR AND A FABRICATING METHOD THEREFOR

This application is a divisional of copending application Ser. No. 08/779,116, filed on Jan. 6, 1997 which is a continuation of Ser. No. 08/510,338, filed on Aug. 2, 1995, the entire contents of which are hereby incorporated by reference.

BACKGROUND OF THE INVENTION

1. Field of the Invention

The present invention relates to a thin film transistor ("TFT") being a semiconductor device, and more particularly to a thin film transistor and fabricating method therefor for vertically forming a drain region, a gate electrode and a source region to reduce an area occupied by a cell, and encircling a channel region by the gate electrode to improve a transistor characteristic, thereby being suitable for a SRAM cell of high packing density.

2. Description of the Prior Art

Generally, a thin film transistor is widely utilized in place of a road resistor in SRAM cells of 1M and higher, or as a switching device for switching a picture data signal of respective pixel areas in liquid crystal displays.

The thin film transistor widely available in various fields preferably has small off current and large on current. For example, in adapting it to the SRAM cells, the power dissipated can be economized and a memory characteristic of a cell can be enhanced.

FIG. 1 is a sectional view illustrating a structure of a conventional P-type MOS thin film transistor fabricated to improve the on/off current ratio.

The conventional P-type MOS thin film transistor has a predetermined gate electrode 12 formed by depositing polysilicon on a P-type silicon substrate 11. A gate insulating layer 13 is formed on the gate electrode 12. A source region 14a and a drain region 14b are formed on the gate insulating layer 13 by the deposition of a body polysilicon 14 and ion implantation of a P-type impurity $BF_2$.

FIGS. 2A to 2D are views for illustrating a process for fabricating the conventional P-type MOS thin film transistor.

Referring to FIG. 2A, the polysilicon is deposited on the substrate 11 or an insulating layer (not shown). Successively, the polysilicon is patterned via a photolithography by means of a gate mask to form the gate electrode 12.

As shown in FIG. 2B, the gate insulating layer 13 and body polysilicon 14 are sequentially deposited on the substrate 11 which includes the gate electrode 12 thereon via a chemical vapor deposition (CVD). Then, the grain size of the body polysilicon is grown via a thermal diffusion method that performs a thermal treatment around a temperature of 600° C. for 24 hours or so.

In FIG. 2C, a photoresist layer 15 is deposited on the body polysilicon 14 to be exposed and developed for masking the source region and drain region. At this time, the masking process is performed to force the source region to overlap the gate electrode 12, and drain region to offset to the gate electrode 12.

The P-type impurity $BF_2$ is ion-implanted onto the body polysilicon 14 of which channel region is masked as described above to form the source region 14a and drain region 14b, thereby completing the conventional P-type MOS thin film transistor.

In a conventional P-MOS thin film transistor, the separation between the source and drain structure, which defines the channel, was oriented in a direction substantially parallel to the substrate, thereby causing the TFT to occupy a large cell area, so that it is not well suited for manufacturing SRAM cells of high packing density.

Also, since the gate electrode formed on the substrate controls the electric charge within the channel, a second gate insulating layer is deposited on the body polysilicon and a second gate is formed thereon in order to inverse overall channel, thereby resulting in a problem of increasing steps in the cell.

Moreover, a mask must be used whenever the gate electrode and channel region are formed, so that the processing for manufacturing thereof is increased to raise manufacturing cost.

SUMMARY OF THE INVENTION

The present invention is devised to solve the above-described problems. Accordingly, it is an object of the present invention to provide a thin film transistor and fabricating method therefor, in which a channel region is vertically formed on a substrate to enhance a thin film transistor characteristic, and a drain region, a gate electrode and a source region are stacked, or vertically aligned, on the substrate for reducing an area occupied by a cell to be suitable for a SRAM cell of high packing density.

To achieve the above object of the present invention, there is provided a thin film transistor including a semiconductor substrate on which a first insulating layer is formed. A first conductive layer is formed on the first insulating layer on which a second insulating layer, a second conductive layer and a third insulating layer are sequentially formed. Then, a contact hole is formed in the second insulating layer, second conductive layer and third insulating layer, and a gate insulating layer is formed along the sidewall of the contact hole. Finally, a third conductive layer doped with an impurity ion is formed on the contact hole covered with the gate insulating layer along the sidewall thereof and on the third insulating layer.

Also, a method for fabricating a thin film transistor is performed by sequentially forming a first insulating layer, a first conductive layer, a second insulating layer, a second conductive layer and a third insulating layer on a semiconductor substrate. Then, a photoresist layer is patterned on the third insulating layer, and the second insulating layer, second conductive layer and third insulating layer are etched to form a contact hole. A fourth insulating layer is formed on the contact hole and third insulating layer, and etched without using a mask to form a gate insulating layer. Thereafter, a third conductive layer is formed for filling up the contact hole having the gate insulating layer thereon and the third insulating layer. Additionally, an impurity is ion-implanted onto the third conductive layer.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Figure 1:
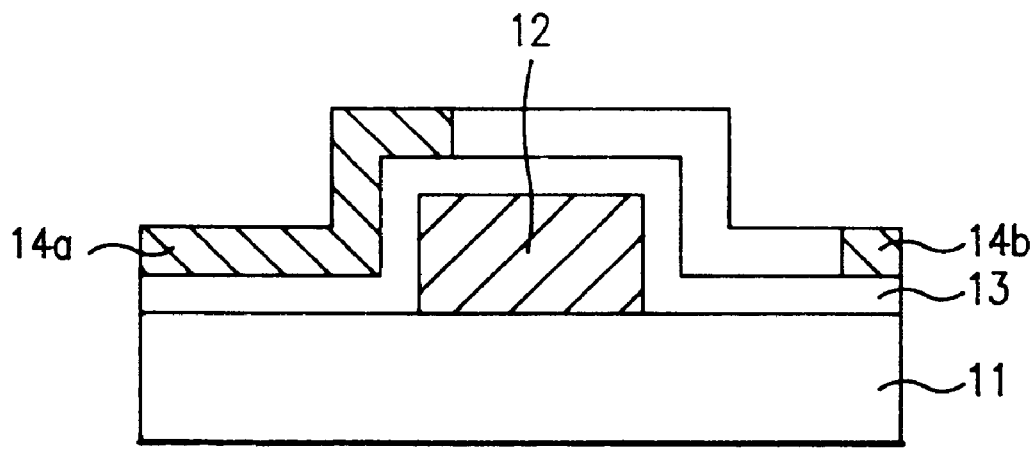
FIG. 1 is a sectional view showing a structure of a conventional P-type MOS thin film transistor.
Figure 2A:
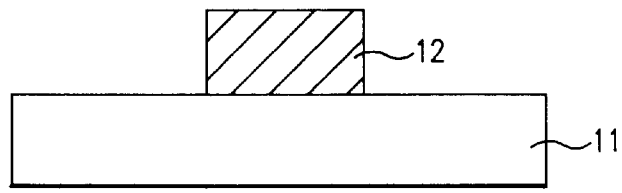
FIGS. 2A to 2D are sectional views showing a process for fabricating the conventional P-type MOS thin film transistor.
Figure 2B:
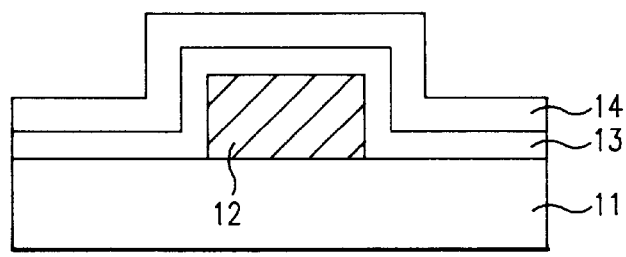
Figure 2C:
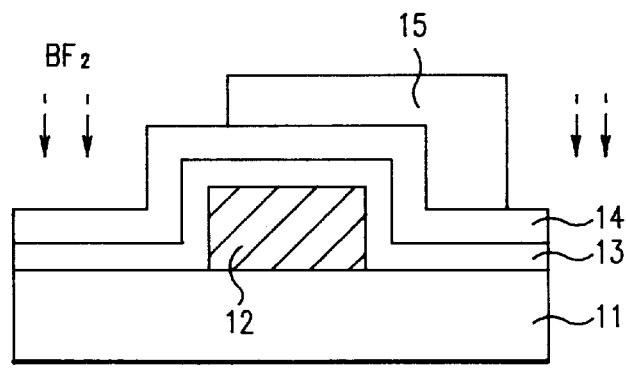
Figure 2D:
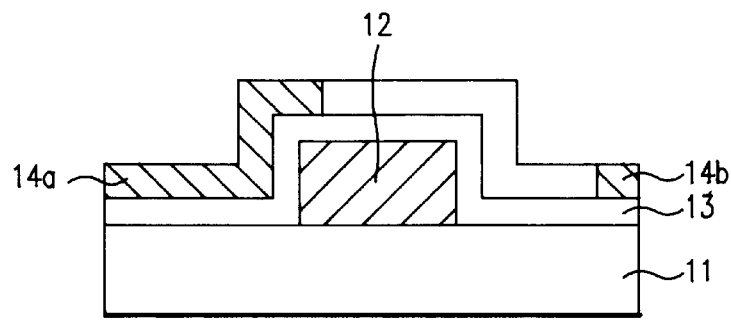
Figure 3:
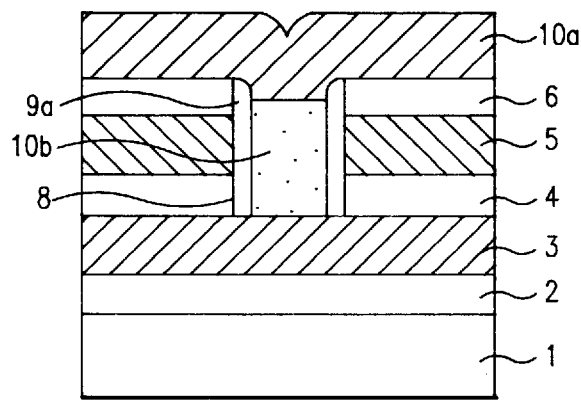
FIG. 3 is a sectional view showing a structure of a P-type MOS thin film transistor according to the present invention.

Referring to FIG. 3, a P-type MOS thin film transistor according to the present invention will be described below. The thin film transistor according to the present invention has a first insulating layer 2 on a semiconductor substrate 1. A first conductive layer 3 serving as a drain region is formed on the first insulating layer 2. Then, a second insulating layer 4, a second conductive layer 5 serving as a gate electrode, and a third insulating layer 6 are sequentially formed on the first conductive layer 3. A contact hole 8 etched by a predetermined depth is formed in the second insulating layer 4, second conductive layer 5 and third insulating layer 6. A gate insulating layer 9a is formed along the sidewall of the contact hole 8. A third conductive layer 10 for filling up the contact 8 is formed on both the contact hole 8 having the gate insulating layer 9a thereon and third insulating layer 6. The third conductive layer 10 is provided with a source region 10a and a channel region 10b via a P-type impurity doping.

Here, the source region 10a is formed around the third conductive layer 10 doped with the P-type impurity $BF_2$, and the channel region 10b is formed around the third conductive layer 10 which fills up the contact hole 8 having the gate insulating layer 9a thereon.

A method for fabricating the thin film transistor constructed as above will be described in detail with reference to FIGS. 4A to 4E.

FIGS. 4A to 4D are sectional views illustrating the process of fabricating the thin film transistor according to the present invention.

Figure 4A:
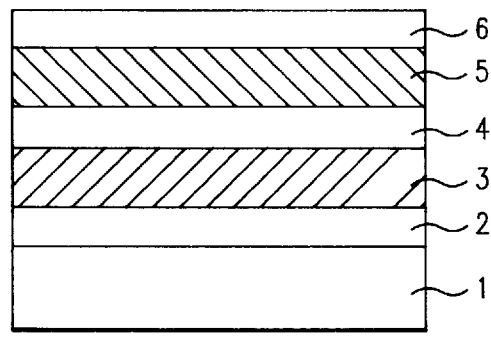
FIGS. 4A to 4E are sectional views showing a process for fabricating the P-type MOS thin film transistor according to the present invention.

As shown in FIG. 4A, an oxide layer is deposited on the semiconductor substrate 1 to form the first insulating layer 2. Then, P$^+$-doped polysilicon is deposited on the first insulating layer 2 to form the first conductive layer 3 which serves as the drain region. The second insulating layer 4, second conductive layer 5 serving as the gate electrode, and third insulating layer 6 are sequentially deposited on the first conductive layer 3.

At this time, the oxide layer is used as the second and third insulating layers 4 and 6, and N$^+$-doped silicon is used as the second conductive layer 5.

Figure 4B:
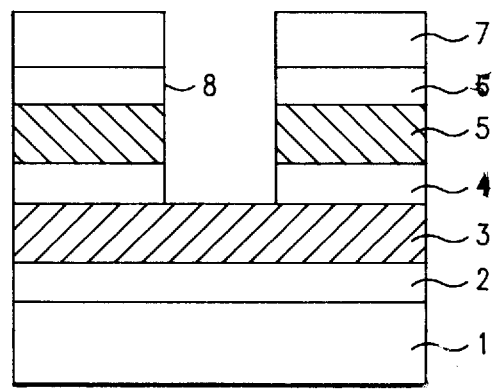

As shown in FIG. 4B, a photoresist layer 7 is coated on the third insulating layer 6 to be selectively exposed and developed, thereby forming a predetermined photoresist layer pattern.

Using the photoresist layer pattern as a mask, the third insulating layer 6, second conductive layer 5 and second insulating layer 4 are sequentially etched to form the contact hole 8.

Figure 4C:
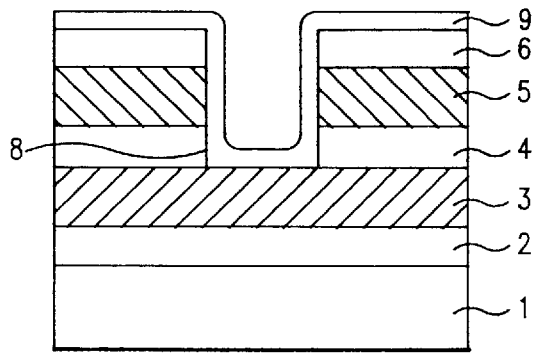

In FIG. 4C, after removing the photoresist layer 7, the fourth insulating layer 9 serving as the gate insulating layer is formed on the contact hole 8 and third insulating layer 6.

At this time, a CVD oxide layer is used as the fourth insulating layer 9.

Figure 4D:
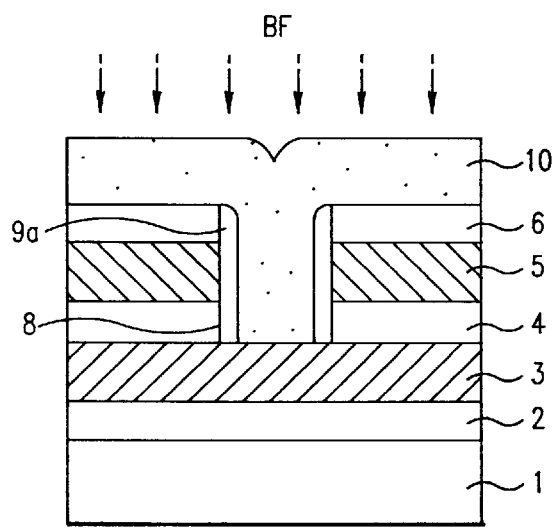

Referring to FIG. 4D, the fourth insulating layer 9 is etched to expose the first conductive layer 3 contacting the lower portion of the contact hole 8 without using a mask, thereby forming the gate oxide layer 9a along the sidewall of the contact hole 8.

Successively, the third conductive layer 10 serving as the source region and channel region is deposited to fill up the contact hole 8 having the gate oxide layer 9a thereon and the third insulating layer 6.

Then, the P-type impurity $BF_2$ is implanted onto the third conductive layer 10. The P-type impurity penetrates deeply enough into the layer 10 to form the source region 10a but does not similarly reach the deeper part of the layer 10, i.e., the deeper part of the layer 10 is not so undoped, resulting in the channel region 10b, thereby completing the thin film transistor.

Figure 4E:
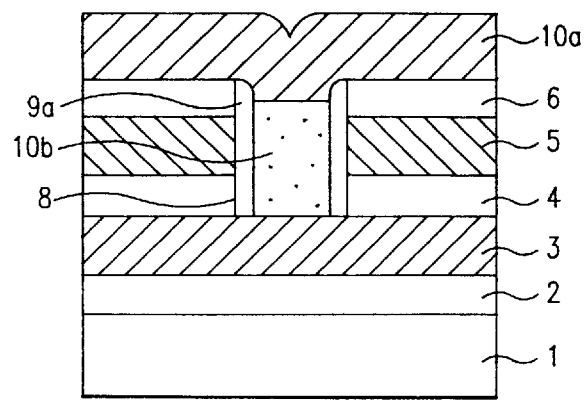

As shown in FIG. 4E, the thin film transistor obtained by the above-described process is constructed such that the second conductive layer used as the gate electrode thoroughly encircles the channel region vertically formed on the substrate.

Therefore, the electric field distribution of the channel becomes consistent to decrease leakage current while increasing on current, so that the characteristic of the thin film transistor is enhanced.

In addition, since the drain region, gate electrode and source region are stacked, or vertically aligned, on the substrate, the cell occupies a small area. Thus, the thin film transistor according to the present invention is suitable for a SRAM cell of high packing density.

Furthermore, the number of using the mask is reduced to lower the manufacturing cost.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A method of producing a thin film transistor TFT comprising:
    a) forming a first insulating layer on a substrate;
    b) forming a first conductive layer on the first insulating layer;
    c) forming a second insulating layer on the first conductive layer;
    d) forming a second conductive layer on the second insulating layer, said second conductive layer becoming a gate electrode in said TFT;
    e) forming a third insulating layer on the second conductive layer;
    f) forming a contact hole through the third insulating layer, the second conductive layer, and the second insulating layer to expose a portion of said first conductive layer;
    g1) depositing a fourth insulating layer in the contact hole and on the third insulating layer;
    g2) etching the fourth insulating layer without using a mask to form a gate insulating layer along a sidewall of the contact hole;
    h) forming a third conductive layer in the contact hole, so as to directly contact said exposed portion of said first conductive layer, and on the third insulating layer; and
    i) selectively introducing an impurity into the third conductive layer.

2. A method for fabricating a thin film transistor as claimed in claim 1, wherein:
    said first conductive layer is formed by depositing P$^+$-doped polysilicon.

3. A method for fabricating a thin film transistor as claimed in claim 1, wherein:

said second conductive layer is formed by depositing N$^+$-doped polysilicon.

4. A method for fabricating a thin film transistor as claimed in claim 1, wherein:

said third conductive layer is formed by depositing P$^+$-doped polysilicon.

5. A method for fabricating a thin film transistor as claimed in claim 1, wherein:

said impurity is doped around said third conductive layer formed on the upper surface of said third insulating layer.

6. A method as in claim 1, wherein the step f) includes:

f1) patterning a photoresist layer on said third insulating layer; and f2) etching said second insulating layer, said second conductive layer, and said third insulating layer to form the contact hole.

7. A method as in claim 1, wherein the step i) includes:

ion-implanting the impurity.

\* \* \* \* \*